United States Patent [19]

Hu

[11] 3,988,823
[45] Nov. 2, 1976

[54] METHOD FOR FABRICATION OF MULTILAYER INTERCONNECTED MICROELECTRONIC DEVICES HAVING SMALL VIAS THEREIN

[75] Inventor: Kuo-Chen Hu, Mission Viejo, Calif.

[73] Assignee: Hughes Aircraft Company, Culver City, Calif.

[22] Filed: Aug. 26, 1974

[21] Appl. No.: 500,793

[52] U.S. Cl. .................................. 29/577; 29/578; 29/625
[51] Int. Cl.² ........................................ H01L 21/88
[58] Field of Search ............ 29/577, 578, 579, 590, 29/591, 625, 628; 317/101 A, 101 CM, 101 CE, 101 D; 174/68.5; 357/54, 71; 96/36.2, 38.4; 156/3, 8, 11, 13, 24; 427/88–91, 93, 96, 97, 124, 154, 156

[56] References Cited
UNITED STATES PATENTS

| | | | |
|---|---|---|---|
| 3,398,032 | 8/1968 | Glang et al. ........................ | 156/3 X |
| 3,615,929 | 10/1971 | Portnoy et al. .................... | 29/577 X |
| 3,632,433 | 1/1972 | Tokuyama ........................ | 29/578 X |
| 3,641,661 | 2/1972 | Canning et al. .................... | 29/577 X |
| 3,700,510 | 10/1972 | Keene et al. ........................ | 156/3 X |
| 3,724,065 | 4/1973 | Carbajac et al. .................... | 29/578 X |
| 3,798,752 | 3/1974 | Fujimoto ........................... | 29/578 X |

Primary Examiner—James R. Duzan
Attorney, Agent, or Firm—Lewis B. Sternfels; W. H. MacAllister

[57] ABSTRACT

Vias or feedthroughs in the order of 0.5 mil diameter or less, for interlayer communication in multilevel interconnected microelectronics, such as large scale integration of active devices and circuits on a wafer, are formed by pyrolytically deposited silicon dioxide covered by RF-sputtered silicon dioxide, or vice-versa. The pyrolytically deposited silicon dioxide can be made sufficiently thin to enable the formation of 0.5 mil diameter or smaller vias therein by conventional etching techniques. The RF-sputtered silicon dioxide is deposited at several times the thickness of the pyrolytically deposited silicon dioxide to bear the main burden of isolation between layers and the vias therein are formed by the use of mushroom masks, such as by the techniques disclosed in U.S. Pat. No. 3,700,510 to form a beveled edge around the via opening to assure continuity of subsequently deposited metal. Two or more small vias may be grouped within a single large via of convenient size and shape. Furthermore, use of two insulation layers placed together decrease the likelihood of aligned undesired openings through both insulation layers to the underlying surface, thereby avoiding later undesired etching or short circuiting through such undesired openings.

11 Claims, 11 Drawing Figures

METHOD FOR FABRICATION OF MULTILAYER INTERCONNECTED MICROELECTRONIC DEVICES HAVING SMALL VIAS THEREIN

BACKGROUND OF THE INVENTION

The Invention herein described was made in the course of or under a contract or subcontract thereunder, with the Department of the Air Force.

1. Field of the Invention

The present invention relates to microelectronic devices with small vias therein and a method for forming small vias for circuit interconnections in fabricating microelectronic devices.

2. Description of the Prior Art and Background Considerations

In the fabrication of microelectronic devices, it has been recognized that significant increases in reliability and decreases in cost can be achieved through the use of full wafer LSI (large scale integration) involving multilevel interconnection technology.

In a wafer requiring small geometry, high density circuits, such as with CMOS and MOS devices, it is necessary to use smaller interconnections on the wafer by metallization routings or lines of 1 mil or less widths on each level of metallization with low resistance contact of the routings through small vias of such small sizes as 0.5 mil and smaller openings between levels.

To achieve such small vias, relatively thin dielectric layers at a thickness of a fraction of a micron must be employed; however, problems arise from such thin layers. Beyond a certain point, the dielectric thickness cannot be further reduced. For interlevel aluminum connection, for example, 0.5 × 0.5 mil vias were achieved on 0.3 micron thick RF-sputtered silicon dioxide, which is the most widely used dielectric material. This thickness was not considered sufficient for interlevel insulation for the basic reason that the pin hole density increases as the thickness of insulation decreases, thereby leading to a greater chance of interlevel short circuits. Furthermore, surface irregularities are less likely to be adequately covered and insulated when the dielectric thickness is too thin. Also, because the vias were etched through the RF-sputtered silicon dioxide, low resistance contact in the vias could not be achieved as a result of the fact that RF-sputtered silicon dioxide reacts with aluminum to form an insoluble residue which is extremely difficult to remove. Such residue hinders electrical contact and therefore increases contact resistance. Although such residue has been successfully avoided and eliminated by use of the mushroom-mask technique disclosed in U.S. Pat. No. 3,700,510, it has been found that, for best results, such a mushroom-mask technique preferably should not be used for via sizes of less than 3 mil diameter.

Another problem exists with reduced line widths, vis-a-vis small diameter vias and dielectric thickness. As an example, present systems can employ routing line widths of approximately 2 mil with a dielectric thickness of the order of 2 microns. A decrease in dielectric thickness by a factor of two would increase line capacitance by a factor of two, which increase in capacitance for a 2 inch line is presently believed to be unacceptable.

Accordingly, sufficient dielectric thickness must be maintained to keep line capacitance within reasonable values and to avoid pinholes. As stated above, an attempt to obtain small vias and low resistance contact therethrough is at variance with increasing dielectric thickness. As the thickness of the dielectric increases, the vias must accordingly increase in size; otherwise, it would not be possible to maintain low resistance contact through the vias between levels of metallization due to residues remaining after certain deposition techniques and due to the difficulty of depositing sufficient metal through such holes because of their combined depth and narrowness and/or because of the ragged edges of the vias, both of which militate against reliable, low resistance contact.

Stated succinctly, the viability of a multilevel technology depends to a large extent on the ability to obtain dependable, low contact resistance vias between relatively thick dielectric layers.

SUMMARY OF THE INVENTION

The present invention overcomes these and other problems. Two layers of insulating material are successively deposited on wafer metallization. One dielectric layer is sufficiently thin so as to enable the formation of vias therein of 0.5 mil diameters and less. A second layer of dielectric insulation of sufficient thickness to provide adequate isolation is deposited over the first layer, preferably using the mushroom-mask technique disclosed in U.S. Pat. No. 3,700,510, to provide larger vias with bevelled or tapered edges. The first layer with the small vias is preferably pyrolytically deposited silicon dioxide while the second layer is perferably radio frequency-sputtered silicon dioxide. It is possible, however, to first lay the sputtered silicon dioxide layer with its larger via on the wafer metallization and thereover then place the thinner pyrolytically deposited silicon dioxide with its smaller via. In either case, the layer with the small holes is sufficiently thin to avoid discontinuities of top metal contact to metal underlying the small vias while the thicker layer with the bevelled edges assures continuity of the top metal. Furthermore, two or more small vias, if too close together, may be encircled by a single large via of convenient size and shape. As a further advantage to the present invention, the use of two layers of insulation significantly decreases the likelihood of through pinhole openings which otherwise exist in either or both of the dielectric layers, thereby reducing, if not absolutely eliminating, the possibility of subsequent etching through such undesired pin holes or openings or short circuitry therethrough from subsequently deposited metal.

Besides avoiding coincidence of pinhole openings, the use of pyrolytic silicon dioxide has another significant advantage. Pyrolytic $SiO_2$, deposited chemically under atmospheric pressure, coats the surface conformally, i.e., edges and surface irregularities will be coated uniformly, in contrast to any deposition in vacuum in which there is always a shadowing effect, thus preventing the deposition on the vertical and underside surfaces of a projection. Therefore, the coverage of any steps on the metallization is much better by the use of pyrolytic silicon dioxide, even though its quality for insulation is inferior to sputtered silicon dioxide.

The use of both pyrolytic and RF-sputtered silicon also significantly reduces problems of contact resistance resulting from residue deposits. Although the etching of pyrolytic $SiO_2$ also leaves some non-conducting residue on the surface of aluminum underneath, the problem is far less severe than in the case of etching sputtered $SiO_2$ over aluminum. The basic difference is in the etchant. To etch sputtered silicon dioxide, a more exotic etchant with high hydrogen fluoride content, which attacks aluminum readily, must be used and the etching operation must be stopped in time so that the aluminum underneath will not be etched away. Thus, it becomes too critical to let the etchant overetch the insulation and then etch away the top skin layer of aluminum so that most of the residue left on the aluminum surface can be removed. With pyrolytic silicon dioxide, an etchant with 80% less hydrogen fluoride can be used to quickly etch pyrolytic and at the same time to attack the aluminum at a very slow rate. As a result, considerable overetch can be tolerated to expose a much cleaner aluminum surface. Also, the effect of any remaining residue, which creates some via resistance in a non-uniform manner, is greatly reduced to a uniform, acceptable level by overnight annealing (about 16 hours) of the wafer at 400° C after the top metallization is delineated.

It is, therefore, an object of the present invention to provide a method for forming vias of 0.5 mils and smaller through insulation of thickness necessary to provide adequate isolation between metallization layers.

Another object is the provision of a method for reducing the incidence of open pin holes in dielectric insulation.

Another object is to provide a means for enabling the fabrication of high density multilevel interconnected microelectronic devices.

Another object is to provide for such small vias while maintaining continuity of metal deposited over and through such small vias.

Another object is the provision of small vias through insulation at a thickness sufficient for maintaining line capacitance between metallization levels at acceptable levels.

Another object is to provide a method of reducing contact resistance by long time annealing.

Other aims and objects as well as a more complete understanding of the present invention will appear from the following explanation of exemplary embodiments and the accompanying drawings thereof.

DESCRIPTION OF THE PREFERRED EMBODIMENT

Figure 1:
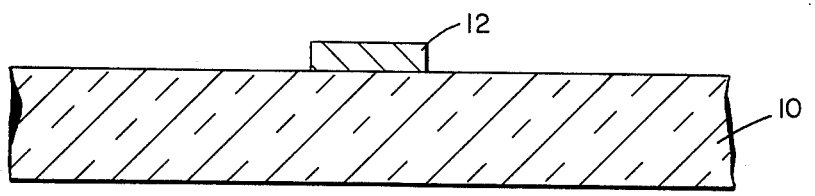
FIG. 1 is a cross-sectional view in elevation of a portion of a wafer substrate with metallization thereon.

Referring to FIG. 1, a substrate 10, such as doped silicon with appropriately formed circuit devices thereon, has formed thereover a first layer metal illustratively shown as a single metal routing 12, such as of aluminum. Such a formation of metal 12 is by conventional deposition, masking and etching operations and may, for example, comprise signal-connects or pads extending from individual or unit circuit devices formed across the surface of wafer or substrate 10. Conventionally, a number of these unit circuit devices are interconnected in multilevel interconnections to form a microelectronic device such as large scale integration of active devices and circuits.

Figure 2:
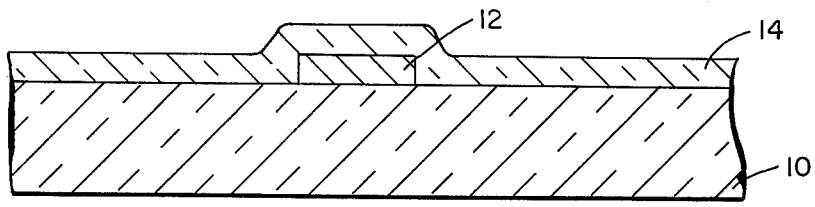
FIG. 2 is a cross-sectional view in elevation showing an added pyrolytically deposited silicon dioxide layer thereon.

Thereafter, as shown in FIG. 2, a layer 14 of pyrolytic silicon dioxide (also referred to as CVD $SiO_2$ or chemical-vapor-deposited silicon dioxide) is deposited on wafer 10 and metal 12 by conventional pyrolytic deposition techniques, such as are provided in a pyrolytic silicon dioxide deposition chamber. The thickness of layer 14 may be as thin as 0.5 micron.

Figure 3:
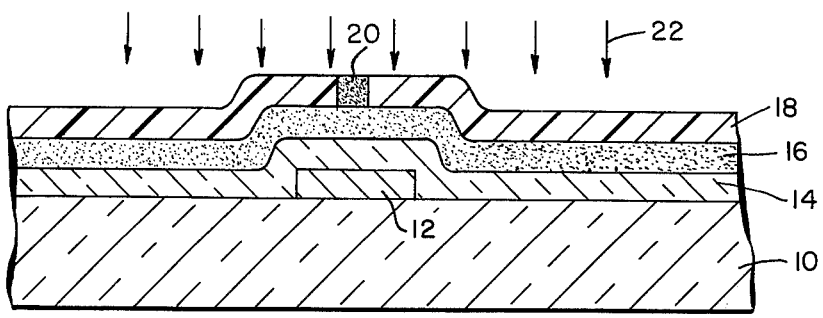
FIG. 3 illustrates placement of a photoresist layer and a mask thereover with exposing rays being applied thereto.
Figure 4:
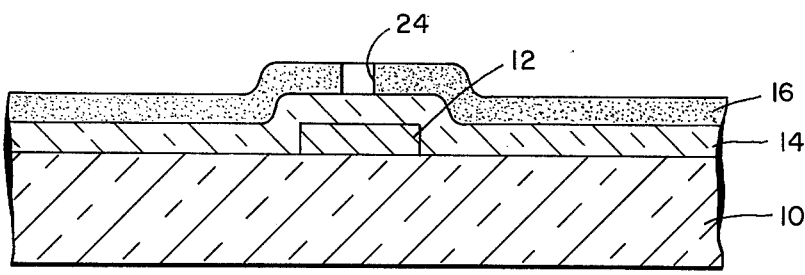
FIG. 4 shows a further step of processing with a photoresist having a hole therein in readiness for etching of the underlying dielectric.

As shown in FIG. 3, a layer 16 of photoresist material is placed over pyrolytic silicon dioxide layer 14 and a mask 18 having a darkened part 20 therein, for example, is placed above the negative photo-resist material. The darkened part 20 is positioned at each location above the pyrolytic glass where it is intended that a small diameter via is to be subsequently etched. Photoresist 16 is then exposed by ultraviolet light, as depicted by rays 22, to provide exposed and unexposed portions of the photoresist. Mask 18 is then removed and the photoresist is developed and baked to provide, as shown in FIG. 4, an opening 24 therein.

Figure 5:
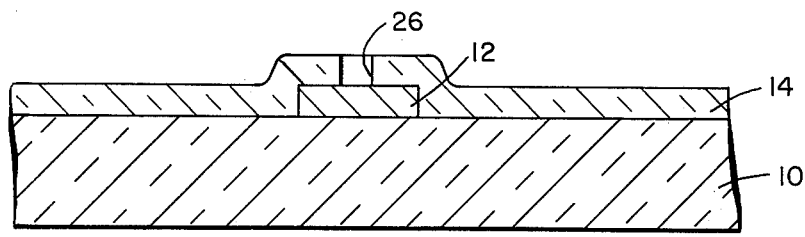
FIG. 5 shows results of etching of a small via in the dielectric layer through the photoresist mask, after stripping thereof from the dielectric.

Those portions of pyrolytic silicon dioxide layer 14 exposed through openings 24 of photoresist mask 16 are etched in any conventional manner, such as by a mixture of acetic acid, ammonium fluoride and hydrogen fluoride. Etching proceeds until a fully developed hole 26, as shown in FIG. 5, is formed in insulation layer 14, FIG. 5 showing photoresist 16 having been striped away.

Figure 6:
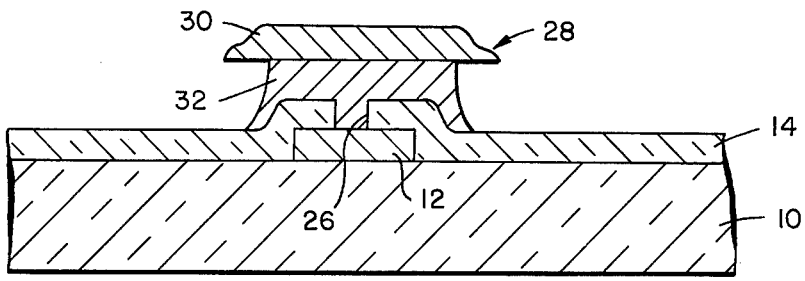
FIG. 6 depicts a formed mushroom-mask placed above the previously formed small via in the pyrolytically deposited silicon dioxide.

Thereafter, as shown in FIG. 6, a mushroom-mask 28 is formed above each hole 26 according to the techniques described in U.S. Pat. No. 3,700,510. Briefly, the mushroom-mask comprises a crown 30 of aluminum and a pedestal 32 of magnesium. This mask is formed by first depositing a layer of magnesium over the substrate and insulation 14 followed by a layer of aluminum over the magnesium layer. The aluminum top layer is then masked and etched by an etchant which is capable of etching aluminum but not magnesium to form each crown 30. Thereafter, utilizing each aluminum crown 30 as a mask, the magnesium is then etched and permitted to be etched sufficiently to be undercut beneath each crown by an etchant capable of etching magnesium but not aluminum.

Figure 7:
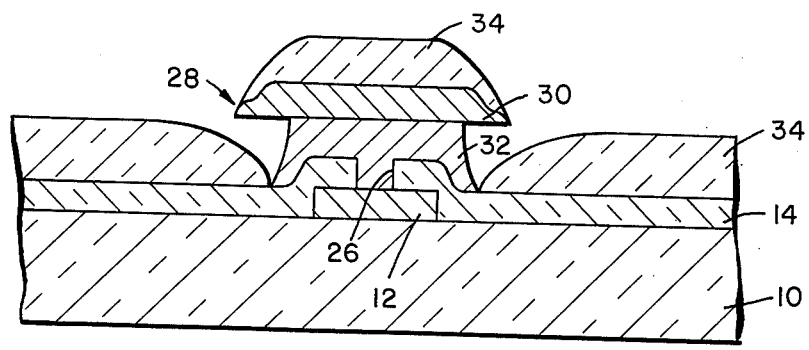
FIG. 7 shows a RF-sputtered silicon dioxide layer deposited over the substrate and the mushroom-mask.
Figure 8:
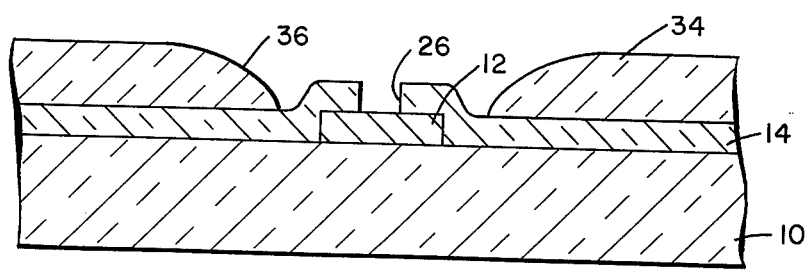
FIG. 8 illustrates the completed via configuration through both layers of silicon dioxide.

The wafer is then loaded within a radio-frequency (RF) sputter system and a layer of silicon dioxide is sputter deposited over the substrate and mushroom-mask 28, to a thickness, for example, of 2.5 microns, as shown in FIG. 7. The use of mushroom-masks permits the formation of tapered openings 36 in RF-sputtered silicon dioxide 34. The mushroom-masks are then floated out by immersing the wafers in dilute nitric acid which disolves the magnesium and, consequently, floats out crowns 30. The result is shown in FIG. 8 in which a larger opening defined by tapered or beveled edges 36 surrounds and overlays the smaller opening 26 in pyrolytic silicon dioxide insulation layer 14.

Figure 9:
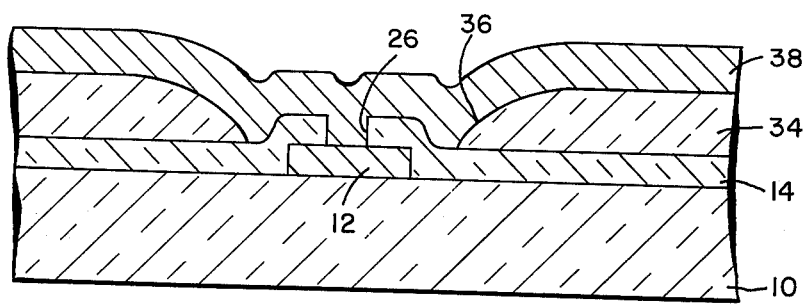
FIG. 9 depicts a layer of metal deposited through the two-via opening into low resistance contact with the underlying metal.

Metallization is then deposited over the substrate and insulation 14 and 34 and through tapered hole 36 and hole 26 as shown in FIG. 9. Formation of metal routings 38 may be made in any desired manner, such as disclosed in copending patent application Ser. No. 272,519 filed July 17, 1972 and U.S. Pat. No. 3,821,045 issued June 28, 1974.

After any further processing, the completely metallized device is then annealed, preferably at 400° C for 16 hours, to reduce any contact resistance, resulting from any remaining residue, to a uniform, acceptable level.

EXAMPLE

A microelectronic device was fabricated utilizing the following process steps:

A. First Level Steps Description

1. Aluminum Evaporation

Load the wafers in an evaporator and evaporate to a film thickness of 1 micron.

2. Mask and Etch

Spin-coat photoresist, prebake, align mask and expose, develop, postbake, and etch.

3. Inspection

Inspect the pattern definition and surface cleanliness after photoresist stripping.

4. Pyrolytic SiO$_2$ Deposition

Load the wafers in pyrolytic SiO$_2$ deposition chamber and deposit to a thickness of about one micron. The thickness is monitored by color change on the wafer surface.

5. Mask and Etch

Same as Step A2 but with clear field first via mask. Etch and inspect after stripping and cleaning.

6. Mushroom Bimetal Deposition

Load the wafers in another evaporator with two boats of evaporants, magnesium and aluminum. Evaporate magnesium first and then aluminum.

7. Mask and Etch

Same as Step A2 but with first via mask. After the aluminum is etched, strip off the photoresist and etch again in dilute nitric acid for the magnesium layer underneath. Rinse clean only after etch.

8. Sputter Glass

Load the wafers in the R.F. Sputter System. Pump down to high vacuum in the $1 \times 10^{-6}$ Torr range. Leak in the filtered argon gas until the pressure is raised to $10 \times 10^{-3}$ Torr. Turn on power and the wafer cooling system. Glass thickness is determined by sputtering time and checked by counting the number of fringes.

9. Mushroom Float-Out

The wafers are immersed in dilute nitric acid to dissolve the magnesium and thus float-out the mushrooms.

10. Inspection

Inspect for the completeness of mushroom removal and surface cleanliness.

B. Second Level Steps Description

1. EBM (Expendible Bimetal Mask) Bimetal Evaporation

Procedure is same as that for mushroom bimetal deposition described in Step A6.

2. Mask and Etch

Same as Step A2 except use second level metal pattern mask. With negative photoresist, the mask is dark pattern on clear field.

3. Inspect

Inspect for pattern definition and cleanliness after photoresist stripping.

4. Aluminum Evaporation

Procedure same as the first aluminum evaporation described in Step A1 except thickness is about 2.5 microns.

5. EBM float out

The bimetal mask is floated out using the same procedure described in Step A9.

6. Inspection

Inspect for the completeness of float out and surface cleanliness.

7. Mushroom Bimetal Evaporation

Procedure same as the first mushroom bimetal deposition described in Step A6.

8. Mask and Etch

Same as previous mask and etch step described in Step A2 except use the second via mask. Inspect after photoresist stripping.

9. Sputter glass

Same as the first sputter glass procedure described in Step A8.

10. Mushroom Float out

Same procedure as floating out the first via mushrooms described in Step A9.

11. Inspect

Inspect for the completeness of float out and surface cleanliness.

C. Third Level Steps Description

1. Evaporate Aluminum

Same procedure as first aluminum evaporation described in Step A1 except that thickness is about 3 microns.

2. Mask and Etch

Same as previous mask and etch step described in Step A2 except using the third level metal pattern mask.

3. Inspect

Inspect for pattern definition after photoresist stripping.

Figure 9A:
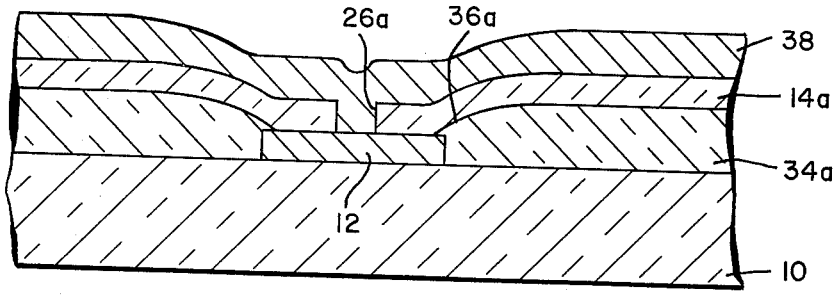
FIG. 9a depicts results wherein the depositing of the glass layers and the vias therein have been reversed from that above.

It is not necessary to deposit pyrolytic silicon dioxide layer 14 first and then RF-sputtered silicon dioxide layer 34, utilizing the above-described via formation means. Rather, as shown in FIG. 9a, an RF-sputtered silicon dioxide layer 34a is first placed over substrate 10 and metal routing 12 to form large vias with tapered edges 36a. Thereafter, a pyrolytically deposited silicon dioxide layer 14a is placed over layer 34a and a small hole 26a is etched therethrough.

Figure 10:
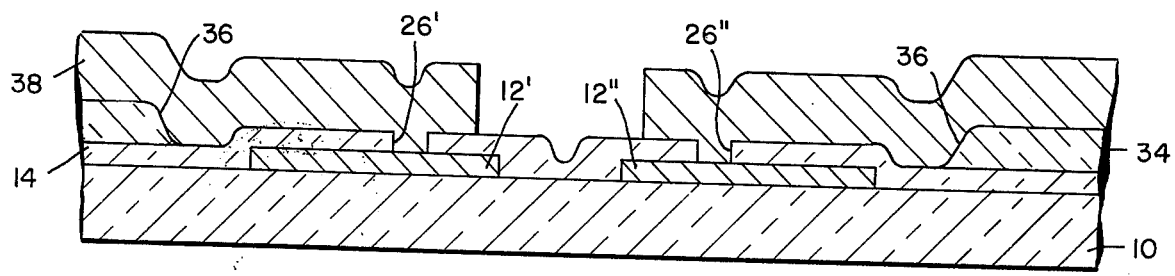
FIG. 10 is a view showing two closely spaced small vias surrounded by a larger via formed by the mushroom-mask process, in which the vias are too close to one another to permit the use of separate mushroom-masks.

Furthermore, as shown in FIG. 10, if small vias, such as vias 26' and 26'', must be placed with only a 1 or 2 mil separation to accomodate high circuit density and small geometry circuits, the present invention may be accomodated to such closely spaced vias. These small vias are placed above respective metal routings 12' and 12'' in pyrolytic silicon dioxide insulation 14. Above this insulation is formed an RF-sputtered insulation 34 with a single mushroom-mask formed via of convenient size and shape, such as a rectangle, circle, or ellipse, surrounding both small vias 26' and 26''. Thereafter, metal routing 38 is deposited over and through vias 36, 26' and 26'' to form the desired interconnections.

This above technique provides low contact resistance through small vias of 0.5 mil diameter or less in pyrolytically deposited silicon dioxide layer 14, yet the continuity of the top conductor, such as conductor 38, at the via step is also provided for, since it is a critical factor in determining the reliability of vias. The mushroom-mask via forming technique provides a beveled edge around the via opening or openings 26 or 26' or 26'' during silicon dioxide sputtering to assure the continuity of metal. As shown in FIGS. 9, 9a and 10, top conductor 38 must come down two steps to made contact with lower conductor 12 through the vias. The first step in layer 34 of sputtered silicon dioxide is high but well beveled. The second step in layer 14 is steep, due to the etching of the pyrolytic silicon dioxide; however, since this layer 14 is relatively thin and layer 34 is usually twice or more thick as the pyrolytic silicon dioxide dielectric layer, the steepness of the etched edge does not deleteriously affect the continuity of the top metal.

Although the invention has been described with reference to particular embodiments thereof, it should be realized that various changes and modifications may be made therein without departing from the spirit and scope of the invention.

What is claimed is:

1. A method for fabricating a multilevel interconnected large scale integrated microelectronic circuit including vias therein having 0.5 mil and smaller openings for interlayer electrical communication of active devices and unit circuits on a silicon wafer in the microelectronic circuit, comprising the steps of:

preparing a silicon wafer with active devices therein and interconnecting the active devices into functional unit circuits at a first level of aluminum metallization including means defining signal-connect pads terminating the unit circuits, by metal evaporation, masking and etching techniques;

depositing a layer of pyrolytic silicon dioxide of approximate 0.5 micron thickness on the first level of metallization within a pyrolytic silicon dioxide deposition chamber for passivating the first level and for creating undesired openings in the pyrolytic layer;

depositing a layer of photoresist material on the layer of pyrolytic silicon dioxide;

placing on the photoresist layer a first mask defining positions of via openings to be etched in the layer of pyrolytic silicon dioxide and to be positioned over the signal-connect means;

exposing the photoresist layer through the mask and thereafter removing the mask;

developing, baking and further processing the exposed photoresist layer for forming therefrom an etch-resistant mask on the pyrolytic silicon dioxide layer with means defining openings in the etch-resistant mask positioned above the positions of the vias to be formed in the pyrolytic silicon dioxide layer;

etching the pyrolytic silicon dioxide layer through the opening means in the etch-resistant mask by applying a mixture of acetic acid, ammonium fluoride and hydrogen fluoride over the etch-resistant mask for forming the vias having at most 0.5 mil openings;

stripping the etch-resistant mask from and thereafter cleaning the etched pyrolytic silicon dioxide layer;

forming aluminum-magnesium masks defining mushroom configurations, each comprising an aluminum crown and a magnesium stem on the etched pyrolytic silicon dioxide layer, with the stems covering the vias in the etched pyrolytic silicon dioxide layer;

sputter depositing a layer of silicon dioxide of a thickness sufficient for adequate insulation over the pyrolytic silicon dioxide layer and over the mushroom-masks in a radio-frequency system for providing tapered deposits at the base of the stems and for closing any of the undesired openings in the pyrolytic silicon dioxide layer;

removing the mushroom-masks by immersing the wafer in a dilute nitric acid bath for dissolving the magnesium stems of the mushroom-masks and thereby for floating-out the mushroom-masks for forming means in the RF-sputtered silicon dioxide layer defining openings of at least 3 mil diameters over the vias having at most the 0.5 mil openings in the pyrolytic silicon dioxide layer;

forming a second level of aluminum metallization defining interconnections among the active devices and the unit circuits over the RF-sputtered silicon dioxide layer and the pyrolytic silicon dioxide layer exposed and surrounded by the opening means for making low resistance electrical contact through the vias and for effecting continuity of the second level of aluminum through the opening means and the vias;

further processing of the silicon wafer from the second level of metallization into the integrated microelectronic circuit; and annealing of the circuit at approximately 400° C for approximately 16 hours for reducing any contact resistance through the opening means and the vias to a uniform, acceptable level.

2. A method for enabling the formation of vias having opening sizes at least as small as 0.5 mil in dielectric insulation while minimizing the occurrence of undesired openings in the insulation and any resulting etching and/or short circuiting therethrough, for properly exposing metal electrical connection areas for circuit interconnections on a wafer in fabricating a microelectronic device, comprising the steps of:

depositing a first layer of insulating material on the wafer;

providing first means for defining vias in the first layer;

depositing a second layer of insulating material on the first layer; and providing means for defining vias in the second layer for configuring one of the first and second vias means in one of the first and second layers with a larger opening size than the other of the first and second vias means in the other of the first and second layers and for locating the other of the vias means within the one of the vias means, said other of the vias means having an opening size as small as 0.5 mil;

said depositing steps comprising the steps of forming means for defining possible undesired openings in at least one of the layers as a result of imperfect processing and closing the undesired openings by the layer which is next deposited, for at least reducing the likelihood of any subsequent etching of and short circuit connections to material underlying the insulating material layers through the undesired openings in subsequent processing of the wafer.

3. A method as in claim 2 wherein the first of the layers comprises radio-frequency sputtered silicon dioxide and the second of the layers comprises pyrolytic silicon dioxide of approximately 0.5 micron thickness.

4. A method as in claim 2 wherein said depositing step comprises the steps of:
    forming the first layer on the wafer; and
    forming the second layer on the first layer for positioning the second vias means within and substantially coplanar with the first vias means.

5. A method as in claim 2 wherein said depositing step comprises the steps of:
    forming the second layer on the wafer; and
    forming the first layer on the second layer for positioning the second vias means within and displaced substantially below the first vias means.

6. A method as in claim 2 wherein said depositing step includes the step of forming the first vias means with sloping peripheral edges.

7. A method as in claim 6 wherein said first vias means forming step comprises the steps of:
    successively depositing first and second layers of differently selectively etchable metals on a surface above the wafer;
    selectively and successively etching the first and second metal layers with different selective etchants for forming a mushroom-shaped mask on top of the surface having a crown formed from the first metal layer and a pedestal formed from the second metal layer;
    depositing the layer of the first insulating material on top of the mushroom-shaped mask crown and the surrounding underlying surface; and
    selectively etching away the pedestal of the mushroom-shaped mask for thereby detaching the crown from the surface, for leaving a tapered opening in the layer of the first insulating material defining the sloping peripheral edges, and for exposing the underlying surface where the mushroom-shaped mask had been located.

8. A method as in claim 2 further including the steps of depositing and forming metal routings across the first and second layers and through the second vias means for establishing low resistance electrical contact with the metal electrical connection areas.

9. A method as in claim 2 further comprising the step of forming a plurality of the second vias means within a single one of the first vias means.

10. A method as in claim 9 further comprising the step of forming metal routing over the first and second layers and through the plurality of the second vias means.

11. A method as in claim 2 further including the step of annealing the wafer.

* * * * *